(12) United States Patent
Min-Hwa et al.

(10) Patent No.: US 8,860,155 B2
(45) Date of Patent: Oct. 14, 2014

(54) MAGNETIC TUNNEL JUNCTION DEVICE AND ITS FABRICATING METHOD

(75) Inventors: Chi Min-Hwa, Beijing (CN); Mieno Fumitake, Beijing (CN)

(73) Assignee: Semiconductor Manufacturing International (Beijing) Corporation (CN)

( * ) Notice: Subject to any disclaimer, the term of this patent is extended or adjusted under 35 U.S.C. 154(b) by 3 days.

(21) Appl. No.: 13/427,116

(22) Filed: Mar. 22, 2012

(65) Prior Publication Data

US 2013/0099336 A1    Apr. 25, 2013

(30) Foreign Application Priority Data

Oct. 19, 2011    (CN) .......................... 2011 1 0317543

(51) Int. Cl.
*H01L 29/82* (2006.01)
*H01L 43/08* (2006.01)
*H01L 43/12* (2006.01)

(52) U.S. Cl.
CPC ............... *H01L 43/12* (2013.01); *H01L 43/08* (2013.01)
USPC ........... 257/421; 257/422; 257/423; 257/425; 257/427; 257/E29.323; 438/3; 365/171; 365/172; 365/173; 365/157; 365/158; 360/324.2; 360/326

(58) Field of Classification Search
CPC ....... H01L 43/08; H01L 27/22; H01L 43/065; G11C 11/16
USPC ........ 257/20, 414, 421–427, E29.323; 438/3; 365/157–158, 171–173; 360/324–326, 360/313
See application file for complete search history.

(56) References Cited

U.S. PATENT DOCUMENTS

| | | | |
|---|---|---|---|
| 6,542,342 B1 * | 4/2003 | Hayashi et al. ............ | 360/324.2 |
| 6,903,396 B2 * | 6/2005 | Tuttle ............................ | 257/295 |
| 7,284,315 B2 * | 10/2007 | Tuttle ........................ | 29/603.14 |
| 2006/0034118 A1 * | 2/2006 | Saito et al. .................... | 365/158 |
| 2009/0243009 A1 * | 10/2009 | Li et al. ......................... | 257/422 |

* cited by examiner

*Primary Examiner* — Jami M Valentine
(74) *Attorney, Agent, or Firm* — Innovation Counsel LLP

(57) ABSTRACT

The present disclosure relates to a magnetic tunnel junction (MTJ) device and its fabricating method. Through forming MTJ through a damascene process, device damage due to the etching process and may be avoided. In some embodiments, a spacer is formed between a first portion and a second portion of the MTJ to prevent the tunnel insulating layer of the MTJ from being damaged in subsequent processes, greatly increasing product yield thereby. In other embodiments, signal quality may be improved and magnetic flux leakage may be reduced through the improved cup-shaped MTJ structure of this invention.

20 Claims, 6 Drawing Sheets

MAGNETIC TUNNEL JUNCTION DEVICE AND ITS FABRICATING METHOD

CROSS-REFERENCE TO RELATED APPLICATIONS

This application claims priority to Chinese Patent Application No. 201110317543.2, filed on Oct. 19, 2011 and entitled "A NOVEL MAGNETIC TUNNEL JUNCTION DEVICE AND ITS FABRICATING METHOD", which is incorporated herein by reference in its entirety.

BACKGROUND OF THE INVENTION

1. Field of the Invention

The present specification relates to a magnetic tunnel junction device and its fabricating method.

2. Description of the Related Art

MRAM (Magnetic Random Access memory) is a nonvolatile magnetic random access memory, which has the advantages of high speed access similar as static random access memory (SRAM), small cell size for high density integration similar as dynamic random access memory, and almost infinite writing cycles, which has attracted much attention nowadays.

Recent MRAM realizes its storage function based on the magnetic tunnel junction (MTJ) structure and electron spin polarization effect. Thus, research on MTJ has been greatly advanced. Furthermore, MTJ has found its important application in sensors.

FIGS. 1 to 5 illustrate a typical fabrication flow of MTJ. The structure shown in FIG. 1 and semiconductor device 100A comprises an underlying layer 103 which represents a completed semiconductor device (herein, only part of the device is shown), a first dielectric layer 100 located on the underlying layer 103, a tungsten plug embedded in the first dielectric layer 100 and in contact with the underlying layer 103, and a second dielectric layer 102 located on the first dielectric layer 100. As shown in FIG. 2 and semiconductor device 100B, an opening is formed within the second dielectric layer 102, and multiple-layers for MTJ 104 are deposited. As shown in FIG. 2, MTJ 104 comprises a top electrode layer 1041, a first synthetic anti-ferromagnetic material layer (SAF) 1042, a tunnel insulating layer 1043, a second synthetic anti-ferromagnetic material layer (SAF) 1044, an anti-ferromagnetic pinning layer 1045, and a bottom electrode layer 1046. The first SAF 1042 comprises a first free sublayer (ferromagnetic material), a Ru layer and a second free sublayer (ferromagnetic material). Since the first SAF 1042 contains such a tri-layer structure, magnetic flux lines will loop within such tri-layer structure as shown in the figure, reducing magnetic flux leakage therefore. The second SAF 1044 has a similar structure as well. The total thickness of multi-layer MTJ is in the range of 100-200 nanometers (nm), thus each layer is thin and in the range of 1-20 nm. The tunnel dielectric layer 1043 is the thinnest and is in the range of 1-3 nm. Note that, although the second SAF 1044 is pinned by the anti-ferromagnetic pinning layer 1045 beneath, in some practical applications, however, it is not necessary to pin the second SAF 1044, and thus the anti-ferromagnetic pinning layer 1045 can be omitted. Further, although magnetic flux lines looping toward the same direction is shown in the figure, it is merely an example, and the loop direction of magnetic flux lines in the first synthetic anti-ferromagnetic material layer (SAF) 1042 can be reversed to represent the storage of 1 or 0.

FIG. 2 shows an optimized MTJ structure. After FIG. 2, then, the stack of multi-layers of MTJ 104 are patterned with a mask and dry etching, so that merely a portion of the MTJ layers 104 is located on the contact 101 as shown in FIG. 3 via semiconductor device 100C. In traditional conventional MTJ processes, etching methods such as FIB or plasma etching or the like are adopted so that various materials in the stack of multiple layers 104 can be etched by the same etching process for process simplicity and achieving minimum MTJ pattern. Next, as shown in FIG. 4 and semiconductor device 100D, a dielectric layer 105 is deposited and planarized (by chemical-mechanical planarization, or CMP) to fill up that open. Then, an electric contact is formed with tungsten plug to connect electrically to the MTJ 104. Then, as in FIG. 5 and semiconductor device 100E, a metal interconnect layer 106 is formed on the second dielectric layer 102 to electrically connect the MTJ 104 through the contact.

It is well known in the art that the above-identified layers are deposited in vacuum with thickness of 1-10 nm of each layer. The deposition is preferable to be conducted sequentially, without breaking the vacuum of process chamber, so as to avoid contamination during the deposition. One deposition for all the multiple layers and followed by etching process may prevent the contamination to the most extent.

On the other hand, as well known in the art, the tunnel insulating layer 1043 has a thickness of about 1-3 nm. When the layer 1043 is exposed to etching plasma and etched as shown in FIG. 3, its edge of the tunnel dielectric layer 1043 is easily damaged. Damaged edge of tunnel insulating layer 1043 may cause high leakage current, breakdown of the insulating layer 1043, and error rate of stored data, as a result, it leads to low yield rate and high manufacturing cost. In summary, all of above may increase MTJ manufacturing cost.

On the other hand, in practice, there are many sophisticated manufacturing lines for CMOS. Hence, it is desirable to fabricate MTJ with CMOS processes.

Besides, with the continuously scaling of semiconductor devices, it is highly desirable to simplify MTJ structures. Therefore, the tri-layer SAF 1042 and the second SAF 1044 of FIG. 2 can be substituted by single layer of ferromagnetic material, with trade-offs of degraded signal intensity due to larger magnetic flux leakage.

In view of above and other aspects, a new technical solution is proposed by the applicants in this present specification.

SUMMARY

One embodiment of the present specification may comprise a magnetic tunnel junction device having a magnetic tunnel junction (MTJ) with a multi-layer structure, characterized in that: the MTJ has a first portion of the multi-layer structure, a second portion of the multi-layer structure located on the first portion, and a spacer located between part of the first portion and part of the second portion.

Preferably, the MTJ device may further comprises a first dielectric layer with an opening provided therein, wherein the MTJ is located in the opening and is in cup shape; the spacer is located between the first portion and the second portion on the sidewalls of the cup-shaped MTJ.

Preferably, the spacer may be adjacent to the tunnel insulating layer of the magnetic tunnel junction, and may be located between the tunnel insulating layer and a bottom electrode.

Preferably, the spacer may be adjacent to the tunnel insulating layer of the magnetic tunnel junction, and may be located between the tunnel insulating layer and a top electrode.

Preferably, the first portion of the MTJ may comprise a bottom electrode, a first magnetic material layer; the second portion of the magnetic tunnel junction comprises a tunnel insulating layer, a second magnetic material layer, and a top electrode.

Preferably, the first portion of the MTJ may comprise a bottom electrode, a first magnetic material layer, and a tunnel insulating layer; the second portion of the MTJ may comprise a second magnetic material layer and a top electrode.

Preferably, the MTJ may further comprise an anti-ferromagnetic pinning layer located between the bottom electrode and the first magnetic material layer.

Preferably, the MTJ may conform in shape with the opening.

Preferably, the MTJ may have a sidewall portion located on the sidewalls of the opening, and a bottom portion located on the bottom of the opening.

Preferably, the cup-shaped MTJ may be formed in the opening through a damascene process.

Preferably, the spacer may have a thickness 10 to 30 times of that of the tunnel insulating layer of the MTJ.

Preferably, the spacer may have a thickness 15 to 20 times of that of the tunnel insulating layer of the MTJ. Preferably, the first MTJ and the second magnetic material layer are synthetic anti-ferromagnetic material layers.

Preferably, the first magnetic material layer and the second magnetic material layer may be single-layered magnetic material layers.

Preferably, the MTJ device may further comprise: a second dielectric layer for filling up the cup-shaped MTJ; an electric contact in the cup-shaped MTJ, which is in contact with the top electrode of the MTJ; a metal layer located on the MTJ and electrically connected to the electric contact.

Another embodiment of the present specification may comprise a method for fabricating a MTJ device, comprising: on a completed underlying semiconductor device, forming a first dielectric layer having an opening provided therein; forming a first portion of a multi-layer MTJ structure in the open; forming a spacer on part of the first portion; forming a second portion of the MTJ.

Preferably, the MTJ may be formed through a damascene process, and the step of forming the MTJ through a damascene process further comprises: sequentially depositing a bottom electrode and a first magnetic material layer in the opening, the bottom electrode and the first magnetic material layer forming a first portion of the MTJ; forming a spacer on the sidewalls of the first portion of the MTJ; subsequently depositing a tunnel insulating layer, a second magnetic material layer, and a top electrode, the tunnel insulating layer, the second magnetic material layer and the top electrode forming a second portion of the MTJ.

Preferably, the MTJ may be formed through a damascene process, and the step of forming the MTJ through a damascene process further comprises: subsequently depositing a bottom electrode, a first magnetic material layer, a tunnel insulating layer in the opening, the bottom electrode, the first magnetic material layer and the tunnel insulating layer forming a first portion of the MTJ; forming a spacer on the sidewalls of the first portion of the MTJ; subsequently depositing a second magnetic material layer and a top electrode, the second magnetic material layer and the top electrode forming a second portion of the MTJ.

Preferably, the method may further comprises forming an anti-ferromagnetic pinning layer between the bottom electrode and the first magnetic material layer.

Preferably, the step of forming a spacer on the sidewalls of the opening may further comprise: depositing a spacer material; carrying out anisotropic etching so as to retaining the spacer on the sidewalls of the opening.

Preferably, the method may further comprise: filling up a second dielectric layer in the cup-shaped MTJ; removing the MTJ and the second dielectric layer at the outside of the opening through a chemical mechanical polishing process until the first dielectric layer is exposed.

Preferably, the method may further comprise: forming an electric contact in the second dielectric layer; forming a metal layer on the top of the MTJ, the electric contact electrically connecting the top electrode of the MTJ to the metal layer.

Another embodiment of the present specification may comprise a magnetic memory device, comprising the magnetic tunnel semiconductor device according to any one of the above aspects of this present specification.

BRIEF DESCRIPTION OF THE DRAWINGS

The present specification will be better understood by reading the following detailed description with reference to accompanying drawings, in which the similar reference labels are used to refer to the similar elements, and wherein.

It should be appreciated, for the simplicity and clarity of description, elements in these drawings are not necessarily shown to scale. For example, for facilitating and improving clarity, some elements are scaled up with respect to other elements. Furthermore, in these drawings, repetitive labels are used to represent corresponding or similar elements.

DETAILED DESCRIPTION

Below, specific embodiments of the present specification is described in detail by example with reference to the drawings.

A damascene process may be employed in this present specification for MTJ fabrication to avoid device damage due to the etching process and low yield consequently. A damascene process is an integrated circuit process by which a metal conductor pattern is embedded in a dielectric film on the silicon substrate. The result is a planar interconnection layer. In some embodiments, a spacer may be provided between a first portion and a second portion of the MTJ, thus preventing the tunnel insulating layer of the MTJ from being damaged in subsequent processes. As a result, the yield may be improved significantly. In some embodiments, single-layered magnetic material layers may be used for decreasing device dimension. In other embodiments, signal quality may be improved and magnetic flux leakage may be reduced through an improved cup-shaped MTJ structure.

Figure 1:
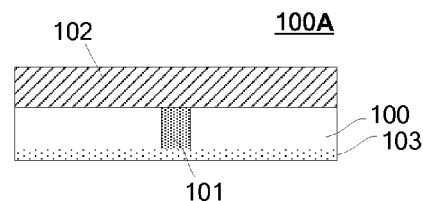
FIGS. 1 to 5 show the structure of semiconductor devices 100A-100E, respectively, and conventional manufacturing method of a MTJ device of the prior art.
Figure 2:
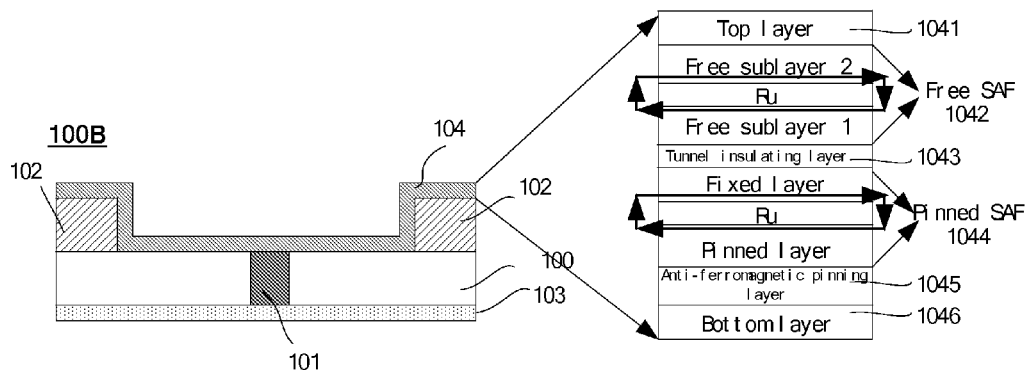
Figure 3:
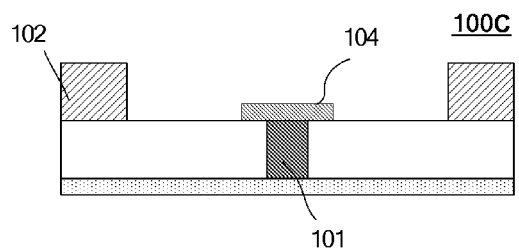
Figure 4:
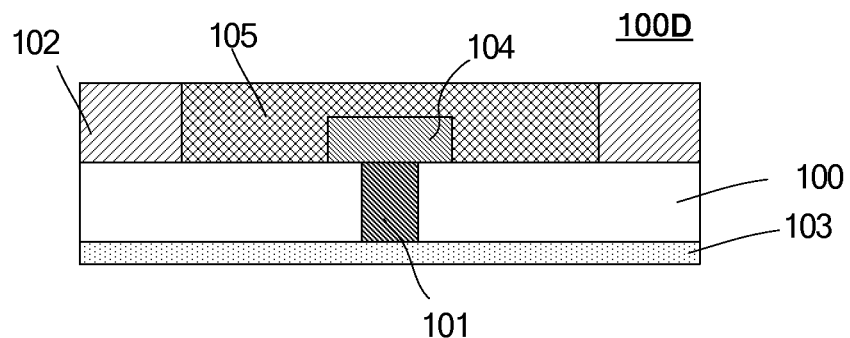
Figure 5:
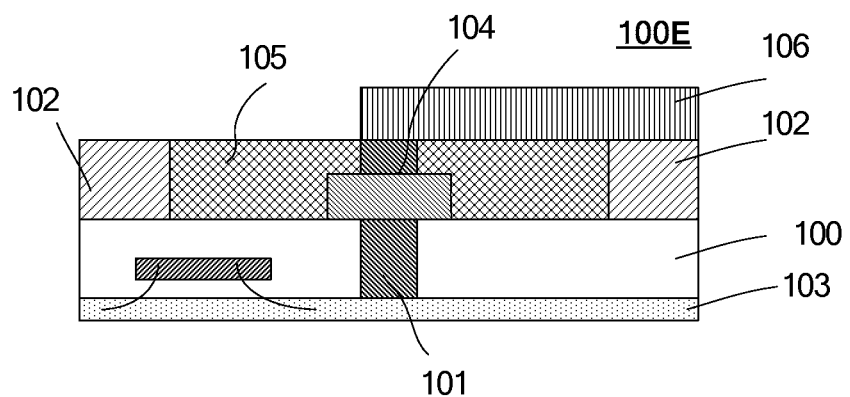
Figure 6:
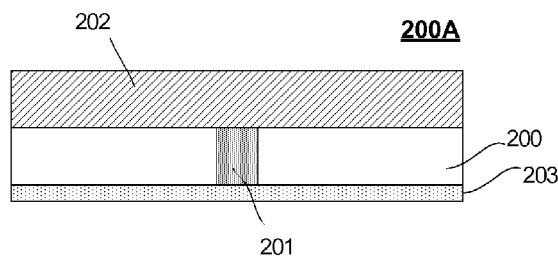
FIGS. 6 to 12 schematically show the structure of semiconductor devices 200A-200G, respectively, and fabricating method of a MTJ device according to an embodiment of the present specification.

As shown in FIG. 6 and semiconductor device 200A, underlying layer 203 denotes a portion of a completed underlying semiconductor device (herein, merely a portion of the semiconductor device is shown). A lower insulating layer 200 may be deposited on a portion of the underlying layer 203, and an electric contact 201 may be formed in the lower insulating layer 200. In one embodiment, the lower insulating layer 200 may be made of $SiO_2$, and the electric contact 201 may have a tungsten plug. However, those skilled in the art may understand that the lower insulating layer 200 may also be made of any other suitable materials, for example, SiN, and the other materials such as Cu, Ti, TiN or the like may be used for the electric contact 201. Next, the surface of the lower insulating layer 200 may be planarized. A first insulating layer 202 may be deposited on the lower insulating layer 200 up to a thickness of 0.3-1 µm. (The first insulating layer 200 may be referred to as a first dielectric layer.) Although the lower insulating layer 200 and the first insulating layer 202 are shown with different, however, the first insulating layer 202 may be made of the same material as that of the lower insulating layer 200.

Figure 7:
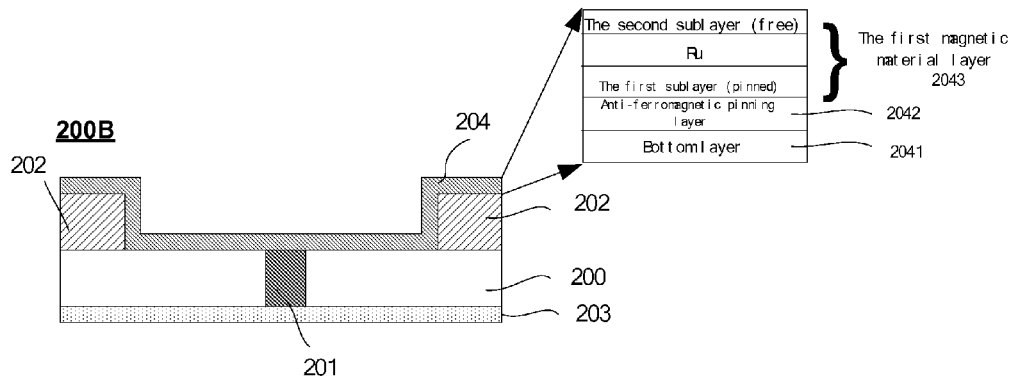

Then, the first insulating layer 202 may be etched with a mask until the electric contact 201 is exposed. Thereby, an opening to be used for the arrangement of MTJ may be formed in the first insulating layer 202. As shown in FIG. 7 and semiconductor device 200B, contrary to continuously depositing all MTJ layers in the prior art, an embodiment of the present specification firstly forms a first portion of the MTJ structure through, for example, a sputtering process. In one embodiment, the first portion of the MTJ 204 comprises a bottom electrode 2041, an anti-ferromagnetic pinning layer 2042, and a first magnetic material layer 2043. In one embodiment, the bottom electrode 2041 may be made of TaN, and may have a thickness of about 5 nm. In the embodiment of FIG. 7, the first magnetic material layer 2043 may be a synthetic ferromagnetic material (SAF) layer, which is composed of a first sublayer, a non-ferromagnetic material layer (such as Ru), and a second sublayer. In the illustrated embodiment, the first sublayer may be pinned by the anti-ferromagnetic pinning layer 2042, and the second sublayer may be a free sublayer. The first portion of MTJ 204 in shape may be in conformity with the opening in the first insulating layer 202.

Figure 8:
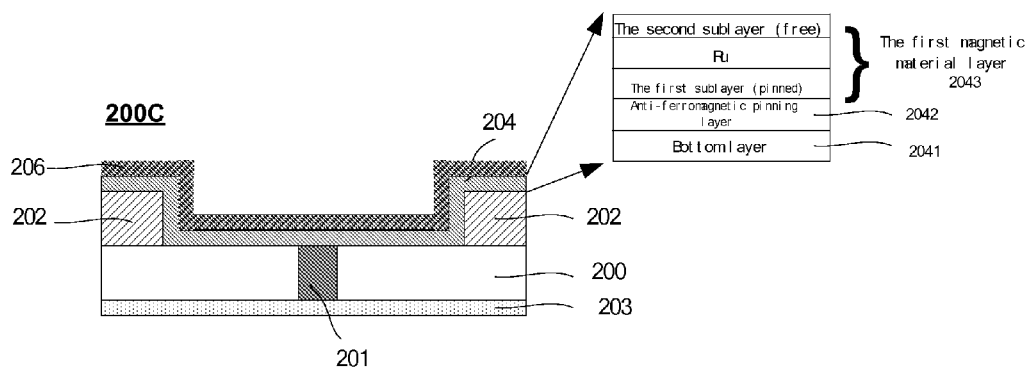

As shown in FIG. 8 and semiconductor device 200C, a spacer layer 206 is deposited with conformity on the first portion of the MTJ. As shown in the figure, the spacer layer 206 may be next to the first magnetic material layer 2043.

Figure 9:
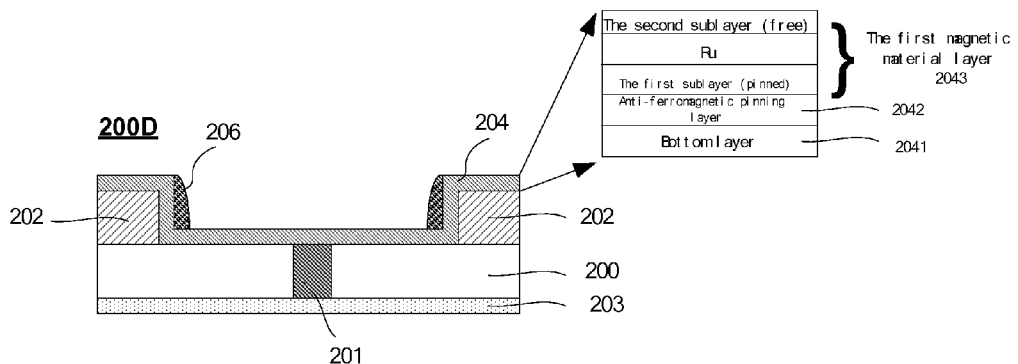

As shown in FIG. 9 and semiconductor device 200D, the spacer layer 206 may be anisotropically etched to expose the surface of the first portion of the MTJ 204. Because of the anisotropical etching, the spacer layer 206 may be removed in the horizontal direction, and a spacer located on the sidewalls of the opening in the vertical direction may be formed.

Figure 10:
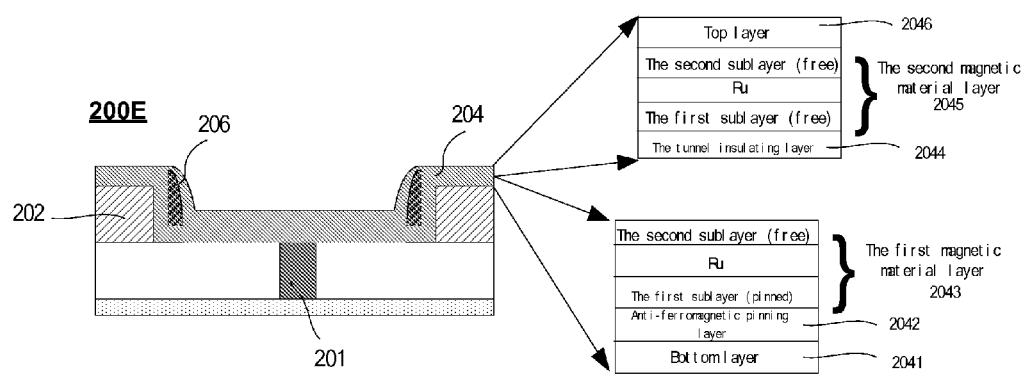

As shown in FIG. 10 and semiconductor device 200E, a second portion of the MTJ 204 may be then formed on the resulted semiconductor structure. In one embodiment, a tunnel insulating layer 2044, a second magnetic layer 2045, and a top electrode 2046 may be subsequently deposited. After deposition, an annealing process may be conducted, for example, at a temperature less then 400° C. According to the embodiment of this present specification, the tunnel insulating layer 2044 may be made of, for example, MgO, SiN, SiO$_2$, Al$_2$O$_3$, or HfO$_2$, and may have a thickness of about 1-2 nm. The top electrode 2046 may be made of, for example, TaN, with a thickness of about 5 nm.

Figure 11:
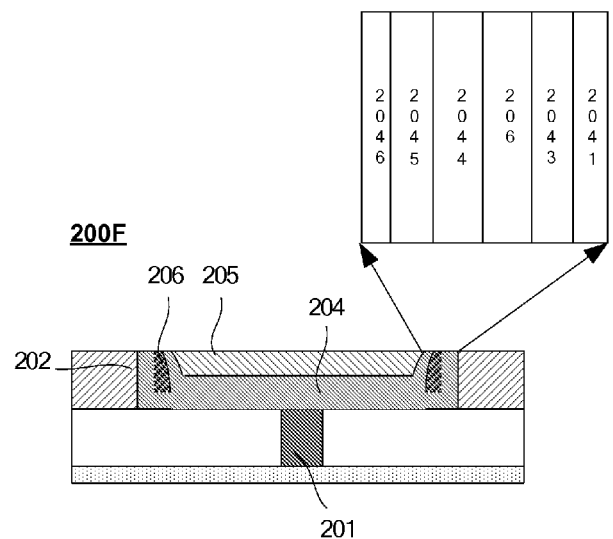

Next, as shown in FIG. 11, a second insulating layer 205 may be deposited on the resulted semiconductor structure. (The second insulating layer 200 may be referred to as a second dielectric layer.) The layer 205 then is planarized with a CMP process until the portion of MTJ layers outside the opening may be removed and the spacer 206 may be exposed. Thus, the first and second portions of the MTJ layers are separated by the spacer 206 on the sidewalls by this Damascene process. In one embodiment, the second insulating layer 205 may be made of the same material as that of the first insulating layer 202.

Since the MTJ may be formed through a damascene process, the MTJ 204 may be formed in a cup shape having a bottom portion and a sidewall portion. The sidewalls of the MTJ may be adjacent to the sidewalls of the opening in the first insulating layer 202, while the bottom of the MTJ may be adjacent to the bottom of the opening.

As shown in FIG. 10, since the spacer 206 layers may be removed through anisotropic etching at the bottom of and outside the opening, the structure of MTJ is the same as the structure of conventional MTJ, i.e., including a bottom electrode 2041, an anti-ferromagnetic pinning layer 2042, a first magnetic material layer 2043, a tunnel insulating layer 2044, a second magnetic material layer 2045, and a top electrode layer 2046. However, the tunnel insulating layer 2044 and the first magnetic material layer 2043 may be separated by the spacer 206 at the sidewalls of the cup-shaped MTJ.

In one embodiment, the spacer 206 may be located on the sidewalls of the opening between the tunnel insulating layer 2044 and the first magnetic material layer 2043. However, in an alternative embodiment of this present specification, the spacer 206 may be located on the sidewalls of the opening between the tunnel insulating layer 2044 and the second magnetic material layer 2045, which may achieve same effects. In that alternative embodiment, the bottom electrode 2041, the anti-ferromagnetic pinning layer 2042, the first magnetic material layer 2043, and the tunnel insulating layer 2044 may be deposited as the first portion of the MTJ, then a spacer 206 may be deposited and may be anisotropically etched, so as to form the spacer 206 at the sidewalls of the opening and to expose the tunnel insulating layer 2044 at the bottom of the opening. Then, the second magnetic material layer 2045 and the top electrode 2046 may be deposited as the second portion of the MTJ. Then followed by deposition a second insulating layer 205 and followed by CMP planarization until the portion of MTJ layers outside the opening is removed and the spacer 206 is exposed.

Figure 12:
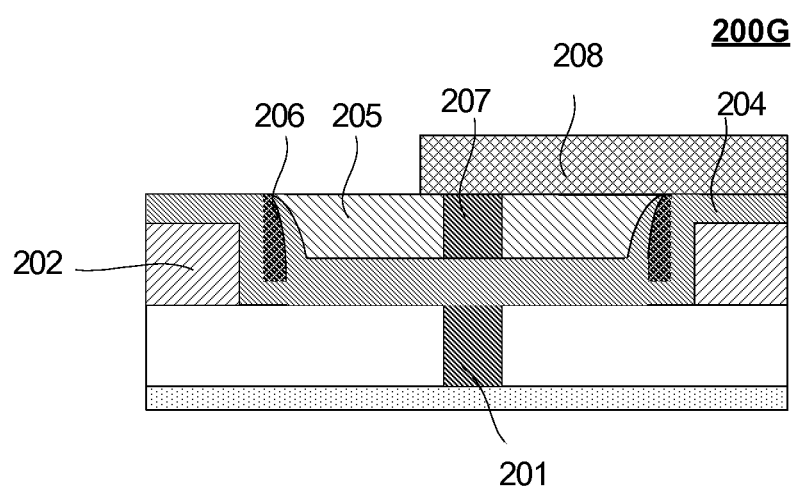

As shown in FIG. 12 and semiconductor device 200G, another electric contact 207 may be formed in the second insulating layer 205, and a metal layer 208 may be formed on the top of the device and may be electrically connected to the electric contact 207.

The fabricating method ends at this point. Although the MTJ structure and its fabricating method according to the embodiments of this present specification have been described by the applicants, however, the above description is not limiting, and is merely given for the purpose of illustration.

According to the present specification, the tunnel insulating layer 2044 may be protected by the spacer 206 at the sidewalls of the opening, that is, the first and second potions of the MTJ may be separated by the spacer 206 which is thick enough. Assuming there is not the spacer 206 at the sidewalls of the MTJ, the tunnel insulating layer 2044 which is merely several nanometers thick is very likely to be damaged when the second insulating layer 205 is removed by CMP grinding. If the tunnel insulating layer 2044 is damaged, the first magnetic material layer 2043 is apt to contact with the second magnetic material layer 2045, which would lead to a short circuit. That action causes device failure. On the other hand, according to the embodiments of this present specification, even if the tunnel insulating layer 2044 is damaged during CMP, the first magnetic material layer 2043 and the second magnetic material layer 2045 may not directly contact with each other and thanks to the presence of the spacer 206.

In one embodiment, the thickness of the spacer 206 may be selected to be about 10-30 times of the thickness of the tunnel insulating layer 2044. In some embodiments, the thickness of the spacer 206 may be selected to be about 15-20 times of the thickness of the tunnel insulating layer 2044. However, it may be also possible to adopt other thickness for preventing the tunnel insulating layer 2044 from being damaged.

On one hand, presence of spacer 206 may cause the MTJ located on the opening sidewalls too unable to achieve tunneling. Therefore, the MTJ located on the sidewall portion may lose its function as the magnetic memory. Nevertheless, the MTJ on the bottom of the opening may not be affected by the spacer 206. Although the MTJ located on the sidewall portion may be unable to function as magnetic memory, the MTJ structure according to the embodiments of this present specification may provide more advantages. For example, it can be seen from FIG. 11 and semiconductor device 200F that, on the two sidewalls of the opening, the first magnetic material layer 2043 and the second magnetic material layer 2045 may establish a magnetic loop in the cup shaped structure, which may greatly reduce magnetic flux leakage and improving magnetic field consequently.

In the illustrated embodiments, each of the first magnetic material layer 2043 and the second magnetic material layer 2045 may be a synthetic anti-ferromagnetic material layer, that is, a multi-layer structure composed of, for example, a first sublayer, non-ferromagnetic material layer, and a second sublayer. However, since the cup-shaped structure of the MTJ may moderate the requirement about magnetic flux leakage, a simplified magnetic material structure may be employed. In one embodiment, each of the first magnetic material layer 2043 and the second magnetic material layer 2045 may be a single magnetic material layer. Furthermore, the anti-ferromagnetic pinning layer 2042 shown in FIG. 10 is not necessary, and may be omitted in some applications (for example, the anti-ferromagnetic pinning layer 2042 is omitted in FIG. 11). It can be seen that the MTJ structure may be simplified by the cup-shaped structure of this present specification, lowering cost and providing excellent performance at the same time.

It can be seen that since it may not be required to etch the MTJ structure, the MTJ structure of this present specification, according to its fabricating method disclosed herein, may be fabricated with equipments that are commonly used in CMOS processes, avoiding expensive etching equipments and saving cost significantly. On the other hand, the MTJ may be divided into two parts in this present specification, and a spacer may be provided there between on the opening sidewalls to prevent the tunnel insulating layer 2044 from being damaged in subsequent processes, increasing product yield consequently. Furthermore, the present specification may simplify the MTJ structure, reducing device dimension and reaching a more preferable balance between device performance and cost.

It should be understood that the terms "substantially" or "about" are used to mean that values or positions described by such terms are expected to be very approximate to the specified values or positions. However, as well known in the art, absolute conformity with specified values or positions may always prevented by tiny deviations. As well known in the art, a deviation up to about ten percent (10%) (for semiconductor doping concentration, up to twenty percent (20%)) may be considered as a reasonable deviation from an ideal target value.

Furthermore, although some oxide or nitride insulating layers are shown as single layers in the drawings and this description, those skilled in the art will appreciate, however, one or more oxide or nitride insulating layers may be adopted depending on specific applications, and in so doing, the process may be changed according to the components of selected insulating layers.

Although this present specification has been specifically described incorporating with specific preferable embodiments, many selections, modifications and changes can be made by those skilled in the art from the previous description. Thus, any such selection, modification and change falling within the real scope and substance of this present specification are tended to be covered by the appended claims below.

What is claimed is:

1. A semiconductor device comprising:
   a first dielectric layer having an opening, the first dielectric layer including sidewalls exposed by removing a portion of the first dielectric layer;
   a magnetic tunnel junction (MTJ) having a multi-layer structure, the MTJ including a first portion formed in the opening and a second portion disposed on the first portion with a spacer interposed between the first portion and the second portion,
   wherein the second portion is directly disposed on the first portion except a region covered by the spacer.

2. The semiconductor device according to claim 1, wherein the MTJ is in a cup shape, the cup-shaped MTJ including a cup-shaped first portion; and
   wherein the spacer is disposed on sidewalls of the cup-shaped first portion.

3. The semiconductor device according to claim 2, wherein the first portion of the MTJ comprises a bottom electrode, a first magnetic material layer, and the second portion of the MTJ comprises a tunnel insulating layer, a second magnetic material layer, and a top electrode.

4. The semiconductor device according to claim 3, wherein the spacer is adjacent to the tunnel insulating layer of the MTJ, and is located between the tunnel insulating layer and a bottom electrode.

5. The semiconductor device according to claim 3, wherein the spacer is adjacent to the tunnel insulating layer of the MTJ, and is located between the tunnel insulating layer and a top electrode.

6. The semiconductor device according to claim 3, wherein the first magnetic material layer and the second magnetic material layer each is a synthetic anti-ferromagnetic material layer.

7. The semiconductor device according to claim 3, wherein the first magnetic material layer and the second magnetic material layer is a single-layered magnetic material layer.

8. The semiconductor device according to claim 2, wherein the first portion of the MTJ comprises a bottom electrode, a first magnetic material layer, and a tunnel insulating layer; and the second portion of the MTJ comprises a second magnetic material layer and a top electrode.

9. The semiconductor device according to claim 6 further comprising an anti-ferromagnetic pinning layer located between the bottom electrode and the first magnetic material layer.

10. The semiconductor device according to claim 2, wherein the MTJ is in conformity with the opening.

11. The semiconductor device according to claim 8, wherein the MTJ has a sidewall portion located on the sidewalls of the opening, and a bottom portion located on the bottom of the opening.

12. The semiconductor device according to claim 2, wherein the cup-shaped MTJ is formed in the opening through a damascene process.

13. The semiconductor device according to claim 2, further comprising:
   a second dielectric layer for filling up the cup-shaped MTJ;
   an electric contact in the cup-shaped MTJ which is in contact with top electrode; and
   a metal layer located on the MTJ and electrically connected to the electric contact.

14. The semiconductor device according to claim 1, wherein the spacer has a thickness 10 to 30 times of that of tunnel insulating layer of the MTJ.

15. The semiconductor device according to claim 1, wherein the spacer has a thickness 15 to 20 times of that of tunnel insulating layer of the MTJ.

16. A magnetic memory device comprising:
   a first dielectric layer having an opening, the opening including sidewalls;
   a magnetic tunnel semiconductor device, the magnetic tunnel semiconductor device including a magnetic tunnel junction (MTJ) having a multi-layer structure,
   wherein the MTJ has a first portion of the multi-layer structure, a second portion of the multi-layer structure located on the first portion, and second dielectric layer formed on the second portion,
   wherein the MTJ is located in the opening, and
   wherein an upper surface of the first portion, the second portion, the first dielectric layer and the second dielectric layer has substantially the same height.

17. The magnetic memory device of claim 16, wherein the MTJ is formed only within the opening.

18. The magnetic memory device of claim 17, the MTJ further comprising a spacer disposed between the first portion and the second portion,
   wherein the upper surface of the spacer is exposed between the first portion and the second portion, and
   wherein the spacer, the first portion and the second portion have substantially the same height.

19. The magnetic memory device of claim 18, wherein the spacer is not formed on a bottom surface of the opening.

20. The magnetic memory device of claim 16, the MTJ further comprising a spacer disposed between the first portion and the second portion,
   wherein the upper surface of the spacer is exposed between the first portion and the second portion, and
   wherein the spacer, the first portion and the second portion have substantially the same height.

* * * * *